(12) United States Patent
Sokolik et al.

(10) Patent No.: US 7,582,893 B2
(45) Date of Patent: Sep. 1, 2009

(54) SEMICONDUCTOR MEMORY DEVICE COMPRISING ONE OR MORE INJECTING BILAYER ELECTRODES

(75) Inventors: Igor Sokolik, East Boston, MA (US); Richard P. Kingsborough, North Chelmsford, MA (US); Aaron Mandell, Boston, MA (US)

(73) Assignee: Spansion LLC, Sunnyvale, CA (US)

( * ) Notice: Subject to any disclaimer, the term of this patent is extended or adjusted under 35 U.S.C. 154(b) by 299 days.

(21) Appl. No.: 11/227,603

(22) Filed: Sep. 15, 2005

(65) Prior Publication Data

US 2007/0058426 A1 Mar. 15, 2007

(51) Int. Cl.
*H01L 29/08* (2006.01)
(52) U.S. Cl. .................. 257/40; 257/288; 257/E27.046; 365/175
(58) Field of Classification Search ................... 257/40, 257/288, E51.027, E27.046, E27.047; 365/175
See application file for complete search history.

(56) References Cited

U.S. PATENT DOCUMENTS

| | | | | |
|---|---|---|---|---|
| 6,023,073 | A * | 2/2000 | Strite ........................ | 257/40 |
| 6,870,183 | B2 * | 3/2005 | Tripsas et al. ................ | 257/40 |
| 2004/0160801 | A1 | 8/2004 | Kriegger et al. | |

FOREIGN PATENT DOCUMENTS

EP 1657760 A1 5/2006
WO 2005018009 A1 2/2005

OTHER PUBLICATIONS

International Search Report dated Dec. 1, 2007, mailed Jan. 16, 2007 for PCT Application Serial No. US2006/034633, 13 pages.
Tengstedt, et al. "Study and Comparison of Conducting Polymer Hole Injection Layers in Light Emitting Devices" (2005) Organic Electronics vol. 6, No. 1, pp. 21-23.
Campbell. "Metal-Organic Interface and Charge Injection in Organic Electronic Devices" (2003) Journal of Vacuum Science and Technology vol. 21, No. 3, pp. 521-531.

* cited by examiner

Primary Examiner—Tuan N. Quach
(74) Attorney, Agent, or Firm—Turocy & Watson, LLP

(57) ABSTRACT

The subject invention provides systems and methods that facilitate formation of semiconductor memory devices comprising memory cells with one or more injecting bilayer electrodes. Memory arrays generally comprise bit cells that have two discrete components; a memory element and a selection element, such as, for example, a diode. The invention increases the efficiency of a memory device by forming memory cells with selection diodes comprising a bilayer electrode. Memory cells are provided comprising bilayer cathodes and/or bilayer anodes that facilitate a significant improvement in charge injection into the diode layers of memory cells. The increased charge (e.g. electrons or holes) density in the diode layers of the selected memory cells results in improved memory cell switching times and lowers the voltage required for the memory cell to operate, thereby, creating a more efficient memory cell.

19 Claims, 6 Drawing Sheets

SEMICONDUCTOR MEMORY DEVICE COMPRISING ONE OR MORE INJECTING BILAYER ELECTRODES

FIELD OF INVENTION

The subject invention relates generally to semiconductor devices and, in particular, to semiconductor memory devices comprising memory cells with one or more injecting bilayer electrodes.

BACKGROUND OF THE INVENTION

The reduction in size of semiconductor components and increased usage of semiconductor processors has lead to an explosion of new electronic devices. Most, if not all, of these electronic devices require some amount of memory in order to function. The proliferation of such devices has significantly increased demand for memory that is efficient in size as well as power consumption. Smaller sized semiconductor components and memories have made numerous hand held electronic devices feasible. Examples of hand-held devices include cell phones, personal radios, walkie-talkies, personal data assistants, palm pilots, pagers, notebook computers, remote controls, voice recorders, audio recorders, video recorders, radios, small televisions, web viewers, cameras, and the like. Although some electronic devices require only relatively small amounts of memory, many newer electronic devices require an increasing amount of memory. Digital cameras, digital audio players, personal digital assistants, and the like generally seek to employ large capacity memory components, such as, for example, flash memory cards, smart media cards, compact flash cards, pen drives and/or other similar devices.

Memory components are generally divided into volatile memory and non-volatile memory. Volatile memory components generally cannot retain information stored or programmed within them when the component loses power. Such memories typically require periodic refresh cycles to maintain their information. Volatile memory components include most forms of random access memory (RAM). RAM is available in many forms such as, for example, synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Non-volatile memory components retain their information even when power to the component is lost. Examples of non-volatile memory components include; ROM, programmable read only memory (PROM), erasable programmable read only memory (EPROM), electrically erasable programmable read only memory (EEPROM), flash EEPROM, and the like. Comparatively, volatile memory components generally provide faster operation at lower cost than non-volatile memory components.

Memory components generally comprise an array of memory elements plus associated semiconductor control circuitry to support various functions such that memory cells are capable of being repeatedly "written", "erased", and "read." A memory element plus supporting semiconductor circuitry is referred to as a memory cell. A memory component comprises a plurality of memory cells. Individual memory cells in a memory component can be "written" with information, "erased", or "read." Individual memory cells are generally programmed or written to an "on" state (logic "1") or erased to an "off" state (logic "0"). When a memory component is "read," the information (the "on" state or "off" state) is retrieved in such a manner that the state of the individual memory cells remains unaltered. Typically, a memory component is addressed in order to be written, erased, or read. Control lines, generally referred to a word lines and bit lines, or row address select (RAS) and column address select (CAS) lines, control access to specific memory devices for purposes of writing, erasing or reading a specific memory cell. Memory components are often fabricated with inorganic solid state technology, such as, crystalline silicon devices. A common semiconductor device employed in memory cells is the metal oxide semiconductor field effect transistor (MOSFET).

Memory component developers and manufacturers are constantly striving to increase storage capacity, reduce power consumption and reduce cost of manufacture for memory components. To increase component densities, manufacturers typically focus on scaling down semiconductor device dimensions (e.g. at sub-micron levels). In order to achieve such densities, smaller feature sizes and more precise feature shapes are often required. This may include the width and spacing of interconnecting lines, spacing and diameter of contact holes, and the surface geometry, such as corners and edges, of various features. A postage-stamp-sized piece of silicon may contain tens of millions of transistors, each transistor as small as a few hundred nanometers. Organic memory cells offer a new technology for achieving even higher memory component densities. As components increase in complexity, power consumption and efficiency of the components becomes more critical. In order to obtain increased utility from such improvements, a resulting memory component requires supporting circuitry capable of rapid state changes.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The subject invention relates generally to semiconductor devices and, in particular, to semiconductor memory devices comprising memory cells with one or more injecting bilayer electrodes. The invention provides for systems and methods that facilitate forming such memory devices. Modern memory arrays typically comprise bit cells that have two discrete components, a memory element and a selection element, such as, for example, a diode. In accordance with one aspect of the invention, a memory cell is formed comprising a bilayer cathode that facilitates a significant improvement in electron injection into the diode layers of selected memory cells. Similarly, in accordance with another aspect of the invention, a memory cell is formed comprising a bilayer anode that facilitates a significant improvement in hole injection into the diode layers of selected memory cells. In accordance with another aspect of the invention, the increased charge (e.g. electrons or holes) density in the diode layers of the selected memory cells results in improved memory cell switching times and lowers the voltage required for the memory cell to operate, thereby, creating a more efficient memory cell.

According to another aspect of the invention, memory cells can be configured in a memory array such that the injecting bilayer electrodes are coupled to one of the control lines (e.g.

word line or bit line). Furthermore, in accordance with another aspect of the invention, a memory array can be configured such that one of the control lines (e.g. word line or bit line) comprises the second layer of the injecting bilayer electrode and the memory cells comprise the first layer of the injecting bilayer electrodes. Further, in accordance with yet another aspect of the invention, a memory array can be configured such that one of the control lines (e.g. word line or bit line) comprises both the first and second layers of the injecting bilayer electrodes and couple directly to the diode layer of the memory cell. In accordance with another aspect of the invention, memory arrays formed from memory cells comprising selection diodes with injecting bilayer electrode(s) will have increased charge density in the diode layers of the selected memory cells. The increased charge density resulting from the injecting bilayer electrodes results in improved memory cell switching times and lower required operational voltage, thereby, creating a more efficient memory array.

To the accomplishment of the foregoing and related ends, certain illustrative aspects of the invention are described herein in connection with the following description and the annexed drawings. These aspects are indicative, however, of but a few of the various ways in which the principles of the invention can be employed and the invention is intended to include all such aspects and their equivalents. Other advantages and novel features of the invention will become apparent from the following detailed description of the invention when considered in conjunction with the drawings.

DETAILED DESCRIPTION OF THE INVENTION

Figure 1:
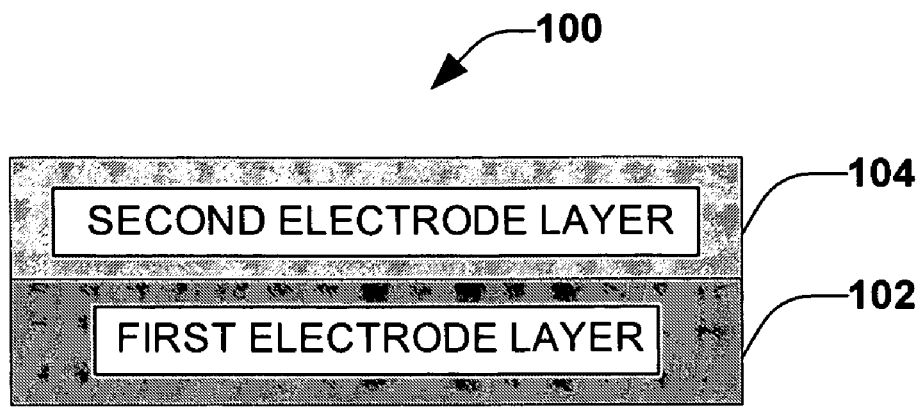
FIG. 1 is an illustration of an injecting bilayer electrode in accordance with an aspect of the invention.

The invention will now be described with reference to the drawings, wherein like reference numerals are used to refer to like elements throughout. The invention will be described with reference to systems and methods that facilitate providing a memory device comprising a bilayer electrode that enhances charge injection into a polymer layer of a diode. It should be understood that the description of these exemplary aspects are merely illustrative and that they should not be taken in a limiting sense.

The term "component" can refer to a computer-related entity, either hardware, a combination of hardware and software, software, or software in execution. For example, a component can be a process running on a processor, a processor, an object, an executable, a thread of execution, a program and a computer. By way of illustration, both an application running on a server and the server can be components. A component can reside in one physical location (e.g., in one computer) and/or can be distributed between two or more cooperating locations (e.g., parallel processing computer, computer network).

FIG. 1 is an illustration of an injecting bilayer electrode 100 in accordance with one or more aspects of the invention. The invention includes systems and methods that facilitate semiconductor memory devices comprising memory cells with one or more injecting bilayer electrodes. Providing an injecting bilayer electrode improves charge injection into the polymer selection layer (e.g. polymer diode layer) of an organic semiconductor device. The injecting bilayer electrode 100 is comprised of a first electrode layer 102 and a second electrode layer 104. The second electrode layer 104 functions primarily as a conventional electrode and provides a means of electrical connection to components external to the device comprising the injecting bilayer electrode. The second electrode layer 104 is generally comprised of a conductive material. A suitable conductive material can include, but is not limited to, material comprising one or more of the following: tungsten, silver, titanium, chromium, germanium, gold, aluminum, barium, calcium, strontium, hafnium, zirconium, vanadium, copper, molybdenum, tantalum, magnesium, manganese, indium, iron, nickel, palladium, platinum, zinc, alloys thereof, indium-tin oxide, other conductive oxides, polysilicon, doped amorphous silicon, metal silicides, metal nitrides, metal carbides, and various conductive composition alloys. Exemplary alloys that can be utilized for the conductive material include Hastelloy®, Kovar®, Invar®, Monel®, Inconel®, stainless steel, magnesium-silver alloy, and various other alloys.

The first electrode layer 102 comprises a material that enhances the ability of the injecting bilayer electrode 100 to inject charge into an adjacent layer, such as, for example, a diode junction layer comprising one or more organic polymers. The material selected for the first electrode layer 102 is chosen based on its ability to improve the injection of charge carriers from the second electrode layer 104 into the material comprising the layer adjacent to the first electrode layer 102. As is described infra, the first electrode layer 102 may be comprised of a variety of materials.

Figure 2:
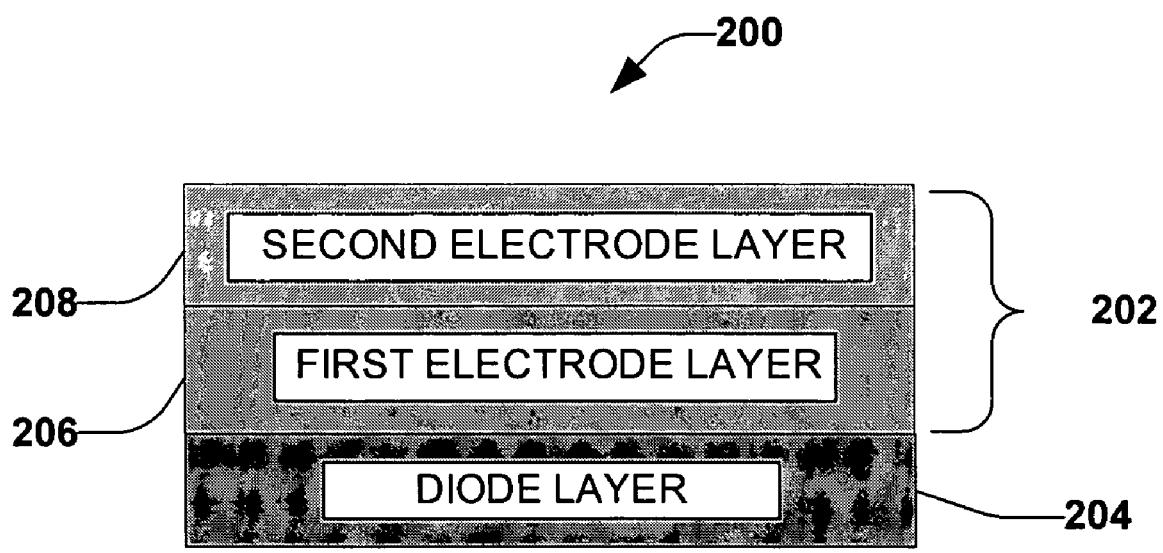
FIG. 2 is an illustration of a system comprised of an injecting bilayer electrode and a diode in accordance with an aspect of the invention.

FIG. 2 illustrates a system 200 comprised of a bilayer electrode 202 and a diode layer 204. The bilayer electrode 202 is comprised of a first electrode layer 206 and a second electrode layer 208. The diode layer 204 is a layer comprising one or more organic polymers suitable for functioning as a diode. The diode layer 204 can be, for example, a selection diode used in conjunction with a memory element.

Figure 3:
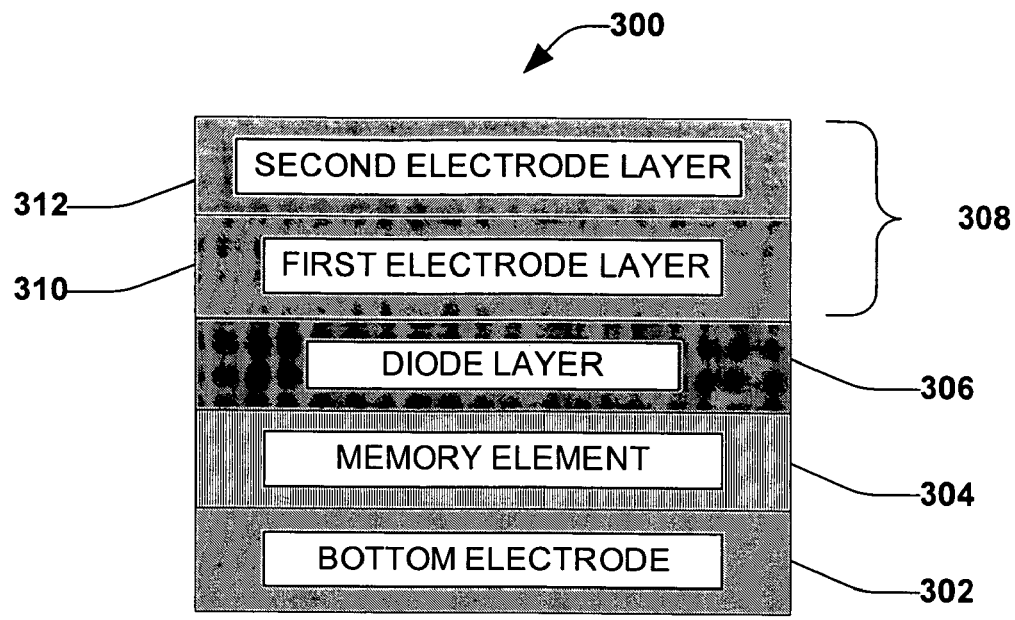
FIG. 3 is an illustration of a memory cell comprising an injecting bilayer electrode in accordance with an aspect of the invention.

FIG. 3 is an illustration of a memory cell 300 formed in accordance with an aspect of the invention. The memory cell 300 is comprised of a bottom electrode 302, a memory element 304, a diode layer 306, and an injecting bilayer electrode 308. The injecting bilayer electrode 308 is comprised of a first electrode layer 310 and a second electrode layer 312.

In accordance with one aspect of the invention, the bottom electrode 302 can be either an anode or a cathode, depending upon the implementation of the device 300. The bottom electrode 302 can comprise any suitable conductive material. Examples of a suitable conductive material can include, but is not limited to, material comprising one or more of the following: tungsten, silver, titanium, chromium, germanium, gold, aluminum, barium, calcium, strontium, hafnium, zirconium, vanadium, copper, molybdenum, tantalum, magnesium, manganese, indium, iron, nickel, palladium, platinum, zinc, alloys thereof, indium-tin oxide, other conductive oxides, polysilicon, doped amorphous silicon, and various conductive composition alloys. Exemplary alloys that can be utilized for the conductive material include Hastelloy®, Kovar®, Invar®, Monel®, Inconel®, stainless steel, magnesium-silver alloy, and various other alloys.

In addition, other conducting or semi-conducting polymers, PEDOT/PSS, polyaniline, polythiothene, polypyrrole material, their derivatives and other doped or undoped conducting and semi-conducting organic polymers, oligomers, monomers or low-molecular weight organic material, conducting and semi-conducting metal oxides and nitrides and silicides, and the like, can be employed for fabrication of the bottom electrode. The doped organic layer can comprise at least one material selected from a group consisting of doped PEDOT, other polythiophenes, polyaniline, polypyrrole, diarylamine, triarylamine and/or starburst organic materials. The dopant for organic layer comprises at least one material selected from a group consisting of PSS, $FeCl_3$, other metal chlorides, $NOPF_6$, TCNQ, $F_4$TCNQ, TCNE, and other strong electron acceptors.

According to one aspect of the invention, the memory element 304 is coupled to the bottom electrode 302. According to another aspect of the invention, the memory element 304 is an organic memory comprising at least one passive region and at least one active region. The passive region contains at least one conductivity-facilitating compound that has the ability to donate and accept charges. The passive region is capable of donating and accepting ions. The passive region can be copper sulfide ($Cu_xS$) formed adjacent to the bottom electrode 302 via thermal vacuum deposition, sputtering, physical vapor deposition (PVD) or a chemical vapor deposition (CVD). Examples of other materials that can be employed for the passive region include one or more of the following: tungsten oxide ($WO_3$), molybdenum oxide ($MoO_3$), titanium dioxide ($TiO_2$), indium oxide ($I_3O_4$), silver sulfide ($Ag_xS$), copper selenide ($Cu_xSe$), iron oxide ($Fe_3O_4$), and the like.

The passive region is operative to transport charge from the bottom electrode 302 to the interface between the organic region and the passive region. The passive region facilitates charge carrier (e.g., electrons or holes) and/or metal ion injection into the organic region and increases the concentration of the charge carrier and/or metal ions in the organic region resulting in a modification of the conductivity of the organic region. Further, the passive region can also store opposite charges in order to balance the total charge of the organic memory element 304.

The passive region can in some instances act as a catalyst when forming the organic region. In this connection, a backbone of a conjugated organic molecule may initially form adjacent to the passive region and grow or assemble away and substantially lateral to the passive region surface. The passive region can be formed by a deposition process (e.g., thermal deposition, PVD, non-selective CVD, and the like) or by a complete sulfidation of pre-deposited thin Cu layer.

In accordance with one or more aspects of the invention, the organic region is formed on top of the passive region and results in an interface between the active and passive regions. The organic region can be formed via any number of suitable techniques. One technique involves growing the organic region from the passive region. Another technique that can be utilized is a spin-on or a spray-on technique which involves depositing a mixture of the material and a solvent, and subsequently removing the solvent. Another suitable technique is chemical vapor deposition (CVD). CVD includes low pressure chemical vapor deposition (LPCVD), plasma enhanced chemical vapor deposition (PECVD), high density chemical vapor deposition (HDCVD), and other VDD techniques. It is not typically necessary to functionalize one or more ends of the organic molecule in order to attach it to an electrode/passive region. Sometimes a chemical bond forms between the conjugated organic polymer and the passive region.

The organic region is typically comprised of a conjugated organic material, such as a small organic molecule and a conjugated polymer. If the organic region is polymer, a polymer backbone of the conjugated organic polymer may extend laterally between the bottom electrode 302 and the electrode bilayer electrode 308. The conjugated organic molecule can be linear or branched such that the backbone retains its conjugated nature. Such conjugated molecules are characterized in that they have overlapping $\pi$ orbitals and that they can assume two or more resonant structures. The conjugated nature of the conjugated organic materials contributes to controllably conductive properties of the controllably conductive media. The organic region and the passive region are collectively referred to as a controllably conductive media or a controllably conductive region. The controllably conductive media can assume more than one conductive state, such as, for example, highly conductive, conductive, semi-conductive, and non-conductive. The conductive properties of the controllably conductive media are modified in a controlled manner by applying various voltages across the controllably conductive media via the bottom electrode 302 and the bilayer electrode 308. In this connection, the conjugated organic material has the ability to donate and accept electrons. Generally, the conjugated organic molecule has at least two relatively stable oxidation-reduction states. The two relatively stable states permit the conjugated organic polymer to donate and accept charges.

The organic material comprising the organic region may be cyclic or acyclic. For some cases, such as organic polymers, the organic material self assembles on the bottom electrode during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyfluorene and related co-polymers; polyporphyrins; porphyrinic macrocycles, thiol derivatized polyporphyrins; poly(p-phenylene)s; poly(imide)s; polymetallocenes such as polyferrocenes, polyphthalocyanines; polyvinylenes; polystiroles; and the like. Additionally, the properties of the organic material can be modified by doping with a suitable dopant.

In accordance with one aspect of the invention, the diode layer 306 is coupled to the memory element 304 and the injecting bilayer electrode 308. In accordance with another aspect of the invention, the diode layer 306 comprises an organic polymer. Examples of suitable organic polymers for the diode layer 306 include at least one material selected from the group consisting of polyacetylene, polyphenylacetylene, polydiphenylacetylene, polyaniline, poly(p-phenylene vinylene), polythiophene, polyfluorenes and related co-polymers, polyporphyrins, porphyrinic macrocycles, thiol derivatized polyporphyrins, poly(p-phenylene)s, poly(imide)s, polymetallocenes such as polyferrocenes and polyphthalocyanines, polyvinylenes, and polystiroles. Another example of suitable organic materials for the diode layer 306 includes low-molecular-weight and polymer hole- and electron-transport materials, such as copper phthalocyanine and other phthalocyanines, diarylamines and triiarylamines, aluminum tris-hydroxyquinolate ($AlQ_3$), triazine derivatives, etc. The diode layer 306 functions as a selection element for the memory element 304. A selection element facilitates control of a voltage applied to, and a resulting current flowing through, a memory element when a voltage is applied across a memory cell. In a memory array, voltages are applied across memory cells through application of control voltages to control lines (e.g. the word line and bit line). Depending upon an external bias applied to the memory cell 300, the diode layer 306 is properly biased to allow the memory element 304 to be programmed, erased, or read without altering the content of the memory element.

The memory element 304 is representative of a memory element that is capable of acquiring a logic state "1" by being written and a logic state "0" by being erased. The memory element 304 is further capable of having its acquired state read without impacting its state. The diode layer 306 operates as a normal diode unless a specific predetermined reverse bias voltage is met or exceeded resulting in breakdown. During normal operation, current will flow through the memory element 304 when a voltage sufficient to turn on the diode layer 306 is applied across the memory cell 300. The nature of the diode allows the application of various voltages to the memory cell 300 to facilitate writing the memory element, erasing the memory element, or reading the acquired state of the memory element.

In accordance with a one aspect of the invention, the injecting bilayer electrode 308 is coupled to the diode layer 306. The bilayer electrode 308 comprises the first electrode layer 310 and the second electrode layer 312. The first electrode layer 310 is formed upon the diode layer 306 and the second electrode layer 312 is deposited upon the first electrode layer 310 such that the first electrode layer 310 is positioned between the second electrode layer 312 and the diode layer 304. In accordance with one aspect of the invention, the first electrode layer 310 and the second electrode layer 312 are formed by sequentially deposition, wherein the first electrode layer 310 is deposited on the diode layer 306 followed by the deposition of the second electrode layer 312 upon the first electrode layer 310. According to one or more aspects of the invention, the first electrode layer 310 and the second layer electrode layer 312 are formed via physical vapor deposition (PVD), i.e. thermal vacuum deposition, sputtering, e-beam deposition, or chemical vapor deposition (CVD). In accordance with one aspect of the invention, the injecting bilayer electrode 308 can be either an injecting bilayer cathode to facilitate electron injection or a injecting bilayer anode, to facilitate hole injection.

When the injecting bilayer electrode 308 is a cathode, the first electrode layer 310 serves to enhance electron injection from the second electrode layer 312 into the organic polymer the diode layer 306. There are numerous combinations of materials which may be selected to implement the desired functionality of the first electrode and second electrode layers.

In accordance with one aspect of the invention, the thin first electrode layer 310 inserted between the organic layer 306 and the second electrode layer 312 leads to significant improvement of the electron injection into the polymer layer and a corresponding decrease in the required operating voltage of the memory device 300. For any externally applied voltage sufficient to enable current flow, the charge density of the resulting from the injecting bilayer cathode 308 is significantly greater than the charge density resulting from a single layer cathode comprised solely of the second electrode layer material. In accordance with one aspect of the invention, the improved voltage and charge density characteristics provide a more a more efficient memory device. A more detailed discussion is provided for a memory cell comprising a bilayer cathode infra with respect to FIG. 5.

In some applications, it is desirable to improve the charge injection of the memory device by improving the injection of holes from the anode into the polymer diode layer. In such a case, the injecting bilayer electrode 308 may comprise materials such that it functions as an injecting anode. In accordance with another aspect of the invention, the thin first electrode layer 310 inserted between the organic layer 306 and the second electrode layer 312 leads to significant improvement of the hole injection into the polymer layer and a corresponding decrease in the required operating voltage of the memory device 300. For any externally applied voltage sufficient to enable current flow, the charge density resulting from the bilayer anode 308 is significantly greater than the charge density resulting from a single layer anode comprised solely of the second electrode layer material. In accordance with one aspect of the invention, the improved voltage and charge density characteristics provide a more efficient memory device. A more detailed discussion is provided for a memory cell comprising an injecting bilayer anode infra with respect to FIG. 6.

Figure 4:
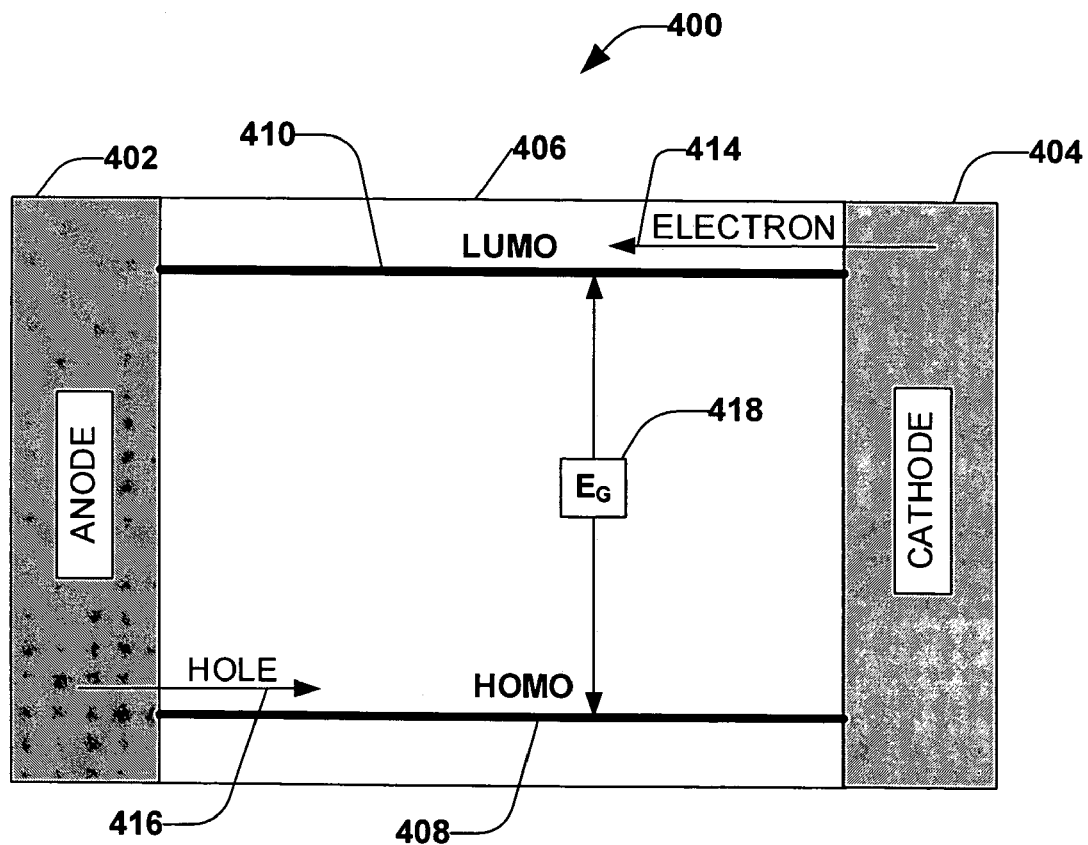
FIG. 4 is an illustration of a diode comprising an organic diode layer between two electrodes.

FIG. 4 is an illustration of a diode 400 comprising an organic diode layer between two electrodes. An understanding of FIG. 4 will aid in the understanding of FIGS. 5 and 6, which represent memory devices formed in accordance with one or more aspects of the invention. The diode device 400 is comprised of a metal anode 402, a metal cathode 404, and an organic diode layer 406.

Although illustrated as an organic material, the diode layer 406 may also be inorganic material or a combination of one or more organic and/or inorganic materials. The diode layer 406 is selected as a material that can be a conductor of both electrons and holes. The cathode 404 comprises a material suitable to inject electrons into the diode layer 406 and is analogous to the n-side of a p-n junction diode. Similarly, the anode 402 comprises a material suitable to inject holes into the diode layer 406 and is analogous to the p side of a p-n junction diode.

According to one aspect of the subject invention, when a polymer is selected as the diode layer 406, the $p_z$ orbitals of the neighboring carbon atoms in the polymer molecule overlap to form delocalized $\pi$ molecular orbitals. The energy level associated with a highest occupied molecular orbital (HOMO) 408 of the diode layer is lower than the energy level associated with the higher energy $\pi$ orbital identified as a lowest unoccupied molecular orbital (LUMO) 410 of the diode layer 406. Energy states associated with orbitals below the HOMO 408 are occupied and those above the LUMO 410 are unoccupied. The energy level associated with the LUMO 410 is greater that the energy level associated with the HOMO 408 with the difference between the two energy levels representing an energy gap ($E_G$) 418.

Once electrons 414 and holes 416 are injected into the organic diode layer 406, each will drift as a result of an applied electric field toward the electrode of the opposite polarity. The injected charges move from molecule to molecule through the disordered polymer diode layer 406 by hopping conduction. In accordance with one aspect of the invention, an injecting bilayer cathode can result in a significant improvement in electron injection into a diode layer as will be illustrated infra in the discussion in regard to FIG. 5.

Figure 6:
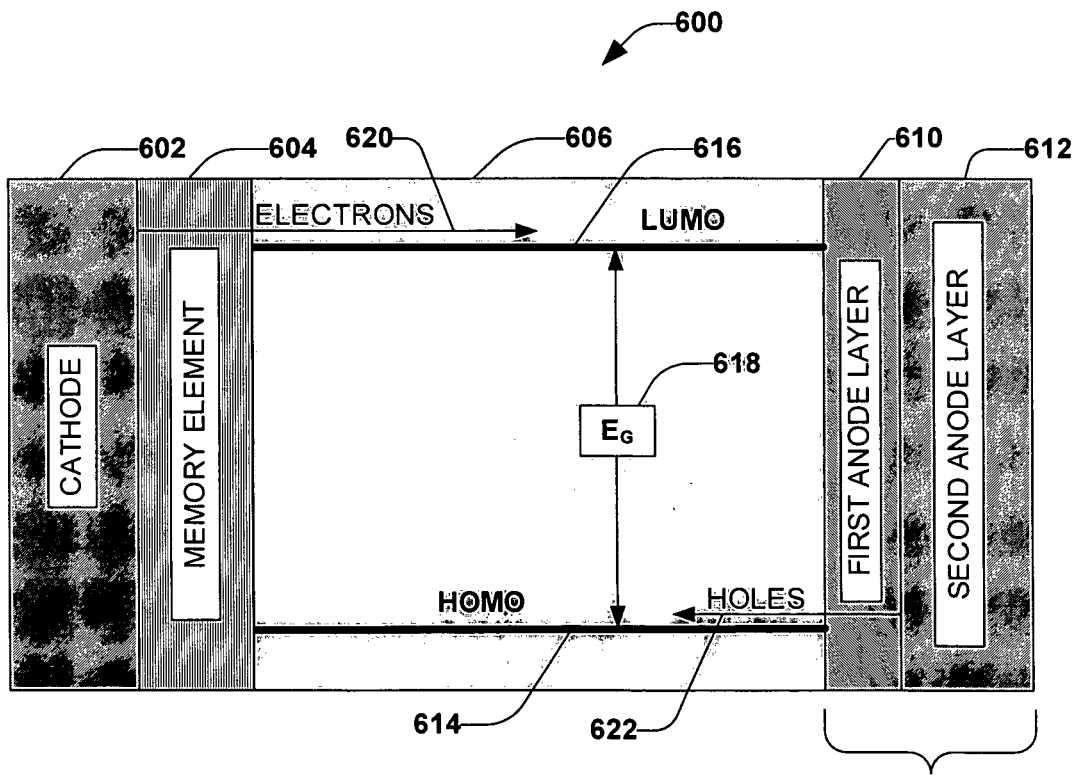
FIG. 6 is an illustration of a memory cell comprising an injecting bilayer anode in accordance an aspect of the invention.

Similarly, in accordance with another aspect of the invention, the use of an injecting bilayer anode can result in a significant improvement in hole injection into the diode layer 406 as will be illustrated infra in the discussion in regard to FIG. 6.

Figure 5:
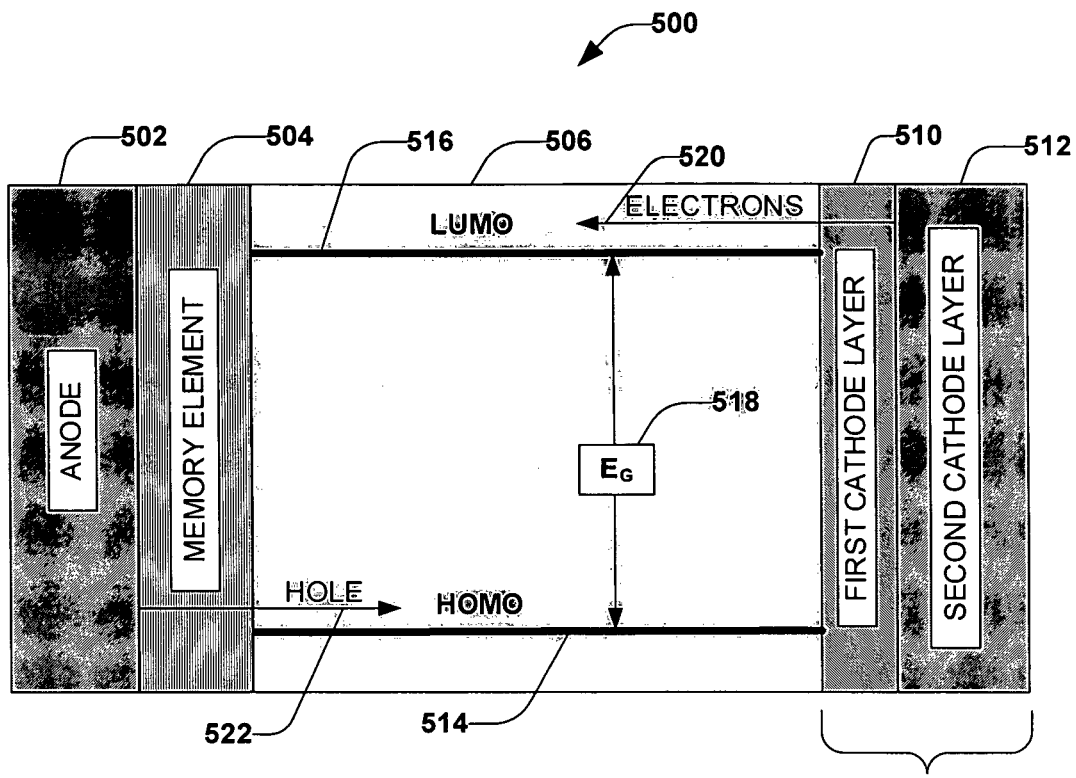
FIG. 5 is an illustration of a memory cell comprising an injecting bilayer cathode in accordance an aspect of the invention.

FIG. 5 is an illustration of a memory cell 500 formed in accordance with one or more aspects of the invention. The memory cell 500 is comprised of an anode 502, a memory element 504, a diode layer 506, and an injecting bilayer cathode 508. The injecting bilayer cathode 508 is comprised of a first cathode layer 510 and a second cathode layer 512. In accordance with an aspect of the invention, the first cathode layer 510 serves to enhance electron injection from the second cathode layer 512 into the diode layer 506.

The anode 502 comprises a material suitable to inject holes, through the memory element 504, into the diode layer 506. Suitable materials for the anode 502 include at least one material selected from the group consisting of tungsten, silver, titanium, chromium, germanium, gold, aluminum, barium, calcium, strontium, hafnium, zirconium, vanadium, copper, molybdenum, tantalum, magnesium, manganese, indium, iron, nickel, palladium, platinum, zinc, alloys thereof, indium-tin oxide, polysilicon, doped amorphous silicon, conducting polymers, semi-conducting polymers, PEDOT/PSS, polyaniline, polythiothene, polypyrrole material, conducting organic polymers, semi-conducting organic polymers, oligomers, monomers, conducting metal oxides, semi-conducting metal oxides, nitrides and silicides. Other suitable anode materials for anode 502 include Hastelloy®, Kovar®, Invar®, Monel®, Inconel®, brass, stainless steel, magnesium-silver alloy, and various other alloys.

The memory element 504 is representative of a memory element that is capable of acquiring a logic state "1" by being written and a logic state "0" by being erased. The memory element 504 is further capable of having its acquired state read without impacting its state. The diode layer 506 operates as a normal diode unless a specific predetermined reverse bias voltage is met or exceeded resulting in breakdown. During normal operation, current will flow through the memory element 504 when a voltage sufficient to turn on the diode layer 506 is applied across the memory cell 500. The nature of the diode allows the application of various voltages to the memory cell 500 to facilitate writing the memory element, erasing the memory element, or reading the acquired state of the memory element.

According to one aspect of the invention, the memory element 504 is coupled to the anode 502. According to another aspect of the present invention, the memory element 504 is an organic memory comprising at least one passive region and at least one active region. The passive region contains at least one conductivity facilitating compound that has the ability to donate and accept charges. The passive region is capable of donating and accepting ions. Material for the passive region can be copper sulfide ($Cu_xS$) formed adjacent to the anode 502 via physical vapor deposition (PVD), i.e. thermal vacuum deposition, sputtering, e-beam deposition, etc. or a chemical vapor deposition (CVD). Examples of other materials that can be employed for the passive region include one or more of the following: tungsten oxide ($WO_3$), molybdenum oxide ($MoO_3$), titanium dioxide ($TiO_2$), indium oxide ($I_3O_4$), copper selenide ($Cu_xSe$), silver sulfide ($Ag_xS$), iron oxide ($Fe_3O_4$), and the like.

The passive region is operative to transport charge from the anode 502 to the interface between the organic region and the passive region. The passive region facilitates charge carrier (e.g., electrons or holes) and/or metal ion injection into the organic region and increases the concentration of the charge carrier and/or metal ions in the organic region resulting in a modification of the conductivity of the organic region. Further, the passive region can also store opposite charges in order to balance the total charge of the organic memory element 504.

The passive region can in some instances act as a catalyst when forming the organic region. In this connection, a backbone of a conjugated organic molecule may initially form adjacent to the passive region and grow or assemble away and substantially lateral to the passive region surface. The passive region can be formed by a deposition process (e.g., thermal deposition, PVD, non-selective CVD, and the like) or by a complete sulfidation of pre-deposited thin Cu layer.

The organic region is formed on top of the passive region and results in an interface between the active and passive regions. The organic region can be formed via any number of suitable techniques. One technique involves growing the organic region from the passive region. Another technique that can be utilized is a spin-on or a spray-on technique which involves depositing a mixture of the material and a solvent, and subsequently removing the solvent. Another suitable technique is chemical vapor deposition (CVD). CVD includes low pressure chemical vapor deposition (LPCVD), plasma enhanced chemical vapor deposition (PECVD), high density chemical vapor deposition (HDCVD), and other CVD techniques. It is not typically necessary to functionalize one or more ends of the organic molecule in order to attach it to an electrode/passive region. Sometimes a chemical bond forms between the conjugated organic polymer and the passive region.

The organic region is typically comprised of a conjugated organic material, such as a small organic molecule and a conjugated polymerThe conjugated organic molecule can be linear or branched such that the backbone retains its conjugated nature. Such conjugated molecules are characterized in that they have overlapping $\pi$ orbitals and that they can assume two or more resonant structures. The conjugated nature of the conjugated organic materials contributes to controllably conductive properties of the controllably conductive media. The organic region and the passive region are collectively referred to as a controllably conductive media or a controllably conductive region. The controllably conductive media can assume more than one conductive state, such as, for example, highly conductive, conductive, semi-conductive, and non-conductive. The conductive properties of the controllably conductive media are modified in a controlled manner by applying various voltages across the controllably conductive media via the anode 502 and injecting bilayer cathode 508. In this connection, the conjugated organic material has the ability to donate and accept electrons. Generally, the conjugated organic molecule has at least two relatively stable oxidation-reduction states. The two relatively stable states permit the conjugated organic polymer to donate and accept charges.

The organic material comprising the organic region may be cyclic or acyclic. For some cases, such as organic polymers, the organic material self assembles on the anode 502 during formation or deposition. Examples of conjugated organic polymers include one or more of polyacetylene (cis or trans); polyphenylacetylene (cis or trans); polydiphenylacetylene; polyaniline; polypyrrole; polyfluorenes and related co-polymers; poly(p-phenylene vinylene); polythiophene; polyporphyrins; porphyrinic macrocycles, thiol derivatized polyporphyrins; poly(p-phenylene)s; poly(imide)s; polymetallocenes such as polyferrocenes, polyphthalocyanines; polyvinylenes; polystiroles; and the like. Additionally, the properties of the organic material can be modified by doping with a suitable dopant.

In accordance with one aspect of the invention, the diode layer 506 is coupled to the memory element 504 and the bilayer cathode 508. In accordance with another aspect of the invention, the material for the diode layer 506 is selected as a material that can be a conductor of both electrons and holes. The diode layer 506 functions as a selection diode for the memory element 504. A selection diode facilitates control of a voltage applied to, and a resulting current flowing through, a memory element when a voltage is applied across a memory cell. Voltages are applied across memory cells through application of control voltages to control lines (e.g. the word line and bit line). Depending upon an external bias applied to the memory cell 500, the diode layer 506 is properly biased to allow the memory element 504 to be programmed, erased, or read without altering the content of the memory element.

In accordance with one aspect of the invention, the diode layer 506 comprises one or more organic polymer materials, such as, for example, polymers comprising at least one material selected from the group consisting of polyacetylene, polyphenylacetylene, polydiphenylacetylene, polyaniline, poly(p-phenylene vinylene), polythiophene, polyfluorenes and related co-polymers, polyporphyrins, porphyrinic macrocycles, thiol derivatized polyporphyrins, poly(p-phenylene)s, poly(imide)s, polymetallocenes such as polyferrocenes and polyphthalocyanines, polyvinylenes, and polystiroles. Another example of suitable organic materials for the diode layer 306 include low-molecular-weight and polymer hole- and electron-transport materials, such as copper phthalocyanine and other phthalocyanines, diarylamines and triiarylamines, aluminum tris-hydroxyquinolate ($AlQ_3$), triazine derivatives, etc. Although illustrated as an organic material, it is understood that the diode layer 506 may also be inorganic material or a combination of one or more organic and/or inorganic materials.

In accordance with one aspect of the invention, the cathode 508 is an injecting bilayer cathode. The injecting bilayer cathode 508 is comprised of the first cathode layer 510 and the second cathode layer 512. The first cathode layer 510 serves to enhance electron injection from the second cathode layer 512 into the organic polymer diode layer 506. There are numerous combinations of materials which may be selected to implement the desired functionality of the first and second cathode layers. In accordance with one aspect of the invention, a combination of materials suitable for the injecting bilayer cathode 508 includes the first cathode layer 510 comprised of an ultra thin layer of LiF, KF, NaF, RbF, or CsF and the second cathode layer 512 comprised of a thin layer of a metal, such as, for example, Al, Ca, ITO, etc. Some exemplary thickness ranges include about 0.5-1.5 nm for the first cathode layer 510 comprised of LiF, KF, NaF, RbF, or CsF, and a thickness of greater than about 200 nm for the second cathode layer 512 comprised of Al, Ca, ITO, etc.

In accordance with one aspect of the invention, the ultra thin first cathode layer 510 of LiF, KF, NaF, RbF, or CsF inserted between the diode layer 506 and the second cathode layer 512 of Al, Ca, ITO, etc., leads to a significant improvement of the electron injection into the diode layer 506 and a corresponding decrease in the required operating voltage for the memory cell 500. For any externally applied voltage sufficient to enable current flow, the charge density resulting from the injecting bilayer cathode 508 is significantly greater than the charge density resulting from a single layer cathode comprised solely of the second cathode layer material. In accordance with one aspect of the invention, the improved voltage and charge density characteristics provide a more efficient memory cell operable at a lower applied external voltage.

A second example of a combination of materials suitable for the injecting bilayer cathode 508 includes the first cathode layer 510 comprised of a relatively thin layer of a metal, such as, for example, Ca, Ba, Li, etc., and the second cathode layer 512 comprised of a thin layer of a metal, such as, for example, Al. Some exemplary thickness ranges include about 0.5-50 nm for the first cathode layer 510 comprised of Ca, Ba, Li, K, Na, Rb, Cs, etc., and a thickness of greater than about 200 nm for the second cathode layer 512 comprised of Al.

In accordance with an aspect of the invention, the relatively thin first cathode layer 510 of Ca, Ba, Li, K, Na, Rb, Cs, etc., inserted between the polymer layer 506 and the second cathode layer 512 of Al, ITO, etc., leads to a significant improvement of the electron injection into the diode layer 506 and a corresponding decrease in the required operating voltage for the memory cell 500. For any externally applied voltage sufficient to enable current flow, the charge density resulting from the injecting bilayer cathode 508 is significantly greater than the charge density resulting from a single layer cathode comprised solely of the second cathode layer material. In accordance with one aspect of the invention, the improved voltage and charge density characteristics provide a more efficient memory cell operable at a lower applied external voltage.

According to one aspect of the subject invention, when a polymer is selected as the diode layer 506, the $p_z$ orbitals of the neighboring carbon atoms in the polymer molecule overlap to form delocalized $\pi$ molecular orbitals. The energy level associated with the highest occupied molecular orbital (HOMO) 514 of the diode layer 506 is lower than the energy level associated with the higher energy $\pi$ orbital identified as the lowest unoccupied molecular orbital (LUMO) 516 of the diode layer 506. Energy states associated with orbitals below the HOMO 514 are occupied and those above the LUMO 516 are unoccupied. The energy level associated with the LUMO 516 is greater that the energy level associated with the HOMO 514 with the difference between the two energy levels representing an energy gap ($E_G$) 518.

Once the electrons 520 and the holes 522 are injected into the organic diode layer 506, each will drift as a result of an applied electric field toward the electrode of the opposite polarity. The injected charges move from molecule to molecule through the disordered polymer junction layer by hopping conduction. In accordance with one aspect of the invention, the bilayer cathode 508 facilitates a significant improvement in electron injection into the diode layer 506. In accordance with another aspect of the invention, the increased charge density in diode layer results in improved memory cell switching times and lowers the voltage required for the memory cell to operate, thereby resulting in a more efficient memory cell.

FIG. 6 is an illustration of a memory cell 600 formed in accordance with one or more aspects of the invention. The memory cell 600 is comprised of a cathode layer 602, a memory element 604, a diode layer 606, and an injecting bilayer anode 608. The injecting bilayer anode 608 is comprised of a first anode layer 610 and a second anode layer 612. In accordance with an aspect of the invention, the first anode layer 610 serves to enhance electron injection from the second anode layer 612 into the diode layer 606.

The cathode 602 comprises a material suitable to inject electrons, through the memory element 604, into the diode layer 606. Suitable materials for the cathode 602 include at least one material selected from a group consisting of tungsten, silver, titanium, chromium, germanium, gold, aluminum, barium, calcium, strontium, hafnium, zirconium, vanadium, copper, molybdenum, tantalum, magnesium, manganese, indium, iron, nickel, palladium, platinum, zinc, alloys thereof, indium-tin oxide, polysilicon, doped amorphous silicon, conducting polymers, semi-conducting polymers, PEDOT/PSS, polyaniline, polythiothene, polypyrrole material, conducting organic polymers, semi-conducting organic polymers, oligomers, monomers, conducting metal oxides, semi-conducting metal oxides, nitrides and silicides. Other suitable materials for the cathode 602 include Hastelloy®, Kovar®, Invar®, Monel®, Inconel®, brass, stainless steel, magnesium-silver alloy, and various other alloys.

The memory element 604 is representative of a memory element that is capable of acquiring a logic state "1" by being written and a logic state "0" by being erased. The memory element 604 is further capable of having its acquired state read without impacting its state. The diode layer 606 operates as a normal diode unless a specific predetermined reverse bias voltage is met or exceeded resulting in breakdown. During normal operation, current will flow through the memory element 604 when a voltage sufficient to turn on the diode layer 606 is applied across the memory cell 600. The nature of the diode allows the application of various voltages to the memory cell 600 to facilitate writing the memory element, erasing the memory element, or reading the acquired state of the memory element.

In accordance with one aspect of the invention, the memory element 604 is coupled to the cathode 602. According to another aspect of the invention, the memory element 604 is an organic memory comprising at least one passive region and at least one active region. The passive region contains at least one conductivity facilitating compound that has the ability to donate and accept charges. The passive region is capable of donating and accepting ions. The passive region can be copper sulfide ($Cu_xS$) formed adjacent to the cathode 602 via physical vapor deposition (PVD), i.e. thermal vacuum deposition, sputtering, e-beam deposition, etc. or a chemical vapor deposition (CVD). Examples of other materials that can be employed for the passive region include one or more of the following: tungsten oxide ($WO_3$), molybdenum oxide ($MoO_3$), titanium dioxide ($TiO_2$), indium oxide ($I_3O_4$), silver sulfide ($Ag_xS$), copper selenide ($Cu_xSe$), iron oxide ($Fe_3O_4$), and the like.

The passive region is operative to transport charge from the cathode 602 to the interface between the organic region and the passive region. The passive region facilitates charge carrier (e.g., holes or electrons) and/or metal ion injection into the organic region and increases the concentration of the charge carrier and/or metal ions in the organic region resulting in a modification of the conductivity of the organic region. Further, the passive region can also store opposite charges in order to balance the total charge of the organic memory element 604.

The passive region can, in some instances, act as a catalyst when forming the organic region. In this connection, a backbone of a conjugated organic molecule may initially form adjacent to the passive region and grow or assemble away and substantially lateral to the passive region surface. The passive region can be formed by a deposition process (e.g., thermal deposition, PVD, non-selective CVD, and the like) or by a complete sulfidation of pre-deposited thin Cu layer.

The organic region is formed on top of the passive region and results in an interface between the active and passive regions. The organic region can be formed via any number of suitable techniques. One technique involves growing the organic region from the passive region. Another technique that can be utilized is a spin-on or spray-on technique which involves depositing a mixture of the material and a solvent, and subsequently removing the solvent. Another suitable technique is chemical vapor deposition (CVD). CVD includes low pressure chemical vapor deposition (LPCVD), plasma enhanced chemical vapor deposition (PECVD), high density chemical vapor deposition (HDCVD) and other CVD techniques. It is not typically necessary to functionalize one or more ends of the organic molecule in order to attach it to an electrode/passive region. Sometimes a chemical bond forms between the conjugated organic polymer and the passive region.

The organic region is typically comprised of a conjugated organic material, such as a small organic molecule and a conjugated polymer. If the organic region is polymer, a polymer backbone of the conjugated organic polymer may extend laterally between the cathode 602 and the injecting bilayer anode 608. The conjugated organic molecule can be linear or branched such that the backbone retains its conjugated nature. Such conjugated molecules are characterized in that they have overlapping π orbitals and that they can assume two or more resonant structures. The conjugated nature of the conjugated organic materials contributes to controllably conductive properties of the controllably conductive media. The organic region and the passive region are collectively referred to as a controllably conductive media or a controllably conductive region. The controllably conductive media can assume more than one conductive state, such as, for example, highly conductive, conductive, semi-conductive, and non-conductive. The conductive properties of the controllably conductive media are modified in a controlled manner by applying various voltages across the controllably conductive media via the cathode 602 and the injecting bilayer anode 608. In this connection, the conjugated organic material has the ability to donate and accept electrons. Generally, the conjugated organic molecule has at least two relatively stable oxidation-reduction states. The two relatively stable states permit the conjugated organic polymer to donate and accept charges.

The organic material comprising the organic region may be cyclic or acyclic. For some cases, such as organic polymers, the organic material self assembles on the cathode during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polypyrrole; polyfluorenes and related co-polymers; polyporphyrins; porphyrinic macrocycles, thiol derivatized polyporphyrins; poly(p-phenylene)s; poly(imide)s; polymetallocenes such as polyferrocenes, polyphthalocyanines; polyvinylenes; polystiroles; and the like. Additionally, the properties of the organic material can be modified by doping with a suitable dopant.

In accordance with one aspect of the invention, the diode layer 606 is coupled to the memory element 604 and the injecting bilayer anode 608. The diode layer 606 is selected as a material that can be a conductor of both holes and electrons. The diode layer 606 functions as a selection element for the memory element 604. Depending upon an external bias applied to the device 600, the diode layer 606 is properly biased to allow the memory element 604 to be programmed, erased, or read without altering the content of the memory element.

In accordance with one aspect of the invention, the diode layer 606 comprises one or more organic polymer materials, such as, for example, polymers comprising at least one material selected from the group consisting of polyacetylene, polyphenylacetylene, polydiphenylacetylene, polyaniline, poly(p-phenylene vinylene), polythiophene, polyfluorenes and related co-polymers, polypyrrole, polyporphyrins, porphyrinic macrocycles, thiol derivatized polyporphyrins, poly (p-phenylene)s, poly(imide)s, polymetallocenes such as polyferrocenes and polyphthalocyanines, polyvinylenes, and polystiroles. Another example of suitable organic materials for the diode layer 306 includes low-molecular-weight and polymer hole- and electron-transport materials, such as copper phthalocyanine and other phthalocyanines, diarylamines and triarylamines, aluminum tris-hydroxyquinolate (AlQ$_3$), triazine derivatives, etc. Although illustrated as an organic material, it is understood that the diode layer 606 may also be inorganic material or a combination of one or more organic and/or inorganic materials.

In accordance with one aspect of the invention, the anode 608 is an injecting bilayer anode. The injecting bilayer anode 608 is comprised of the first anode layer 610 and the second anode layer 612. The first anode layer 610 serves to enhance hole injection from the second anode layer 612 into the organic polymer diode layer 606. There are numerous combinations of materials which may be selected to implement the desired functionality of the first and second anode layers. In accordance with one aspect of the invention, a combination of materials suitable for the injecting bilayer anode 608 includes the first anode layer 610 comprised of a layer of doped organic material and the second anode layer 612 comprised of a thin layer of a metal, such as, for example, Al, ITO, etc. Examples of suitable doped organic materials for the first anode layer 610 include PEDOT/PSS, polyaniline, doped TDATA, m-MTDATA, 1-TNATA, 2-TNATA, and the like, etc. An exemplary thickness range for the second anode layer 612 comprises a thickness of greater than about 200 nm.

In accordance with an aspect of the invention, the first anode layer 610 of doped organic material inserted between the diode layer 606 and the second anode layer 612 of Al, W, ITO, etc. leads to significant improvement of the hole injection into diode layer 606 and a corresponding decrease in the required operating voltage of the memory cell 600. For any externally applied voltage sufficient to enable current flow, the charge density resulting from the injecting bilayer anode 608 is significantly greater than the charge density resulting from a single layer anode comprised solely of the second anode layer material. In accordance with one aspect of the invention, the improved voltage and charge density characteristics provide a more efficient memory cell operable at a lower applied external voltage.

In accordance with another aspect of the invention, a second example of a combination of materials suitable for the injecting bilayer anode 608 includes the first anode layer 610 comprised of a thin layer of polymer and the second anode layer 612 comprised of a thin layer of a metal, such as, for example, Al, ITO, etc. Examples of suitable polymers for the anode layer 610 include polyaniline (PANI), and polyethylenedioxythiophene (PEDT). The polymer first anode layer 610 can be spin coated onto the polymer diode layer 606. An exemplary thickness range for the second anode 612 comprises a thickness of greater than about 200 nm.

In accordance with an aspect of the invention, the relatively thin the first anode layer 610 of polymer inserted between the polymer layer 606 and the second anode layer 612 of Al, W, ITO, etc., leads to significant improvement of the hole injection into the diode layer and a corresponding decrease in the required operating voltage of the memory cell 600. For any externally applied voltage sufficient to enable current flow, the charge density resulting from the injecting bilayer anode 608 is significantly greater than the charge density resulting from a single layer anode comprised solely of the second anode layer material. In accordance with one aspect of the invention, the improved voltage and charge density characteristics provide a more efficient memory cell operable at a lower applied external voltage.

According to one aspect of the subject invention, when a polymer is selected as the diode layer 606, the p$_z$ orbitals of the neighboring carbon atoms in the polymer molecule overlap to form delocalized $\pi$ molecular orbitals. The energy level associated with the highest occupied molecular orbital (HOMO) 614 of diode layer 606 is lower than the energy level associated with the higher energy $\pi$ orbital identified as the lowest unoccupied molecular orbital (LUMO) 616 of the diode layer 606. Energy states associated with orbitals below the HOMO 614 are occupied and those above the LUMO 616 are unoccupied. The energy level associated with the LUMO is greater that the energy level associated with the HOMO with the difference between the two energy levels representing an energy gap, (E$_G$) 618.

Once the holes 622 and the electrons 620 are injected into the organic diode layer 606, each will drift as a result of an applied electric field toward the electrode of the opposite polarity. The injected charges move from molecule to molecule through the disordered polymer junction layer by hopping conduction. In accordance with one aspect of the invention, the injecting bilayer anode 608 facilitates a significant improvement in the hole injection into the diode layer 606. In accordance with another aspect of the invention, the increased charge density in the diode layer 606 results in improved memory cell switching times and lowers the voltage required for the memory device 600 to operate thereby resulting in a more efficient memory cell.

Figure 7:
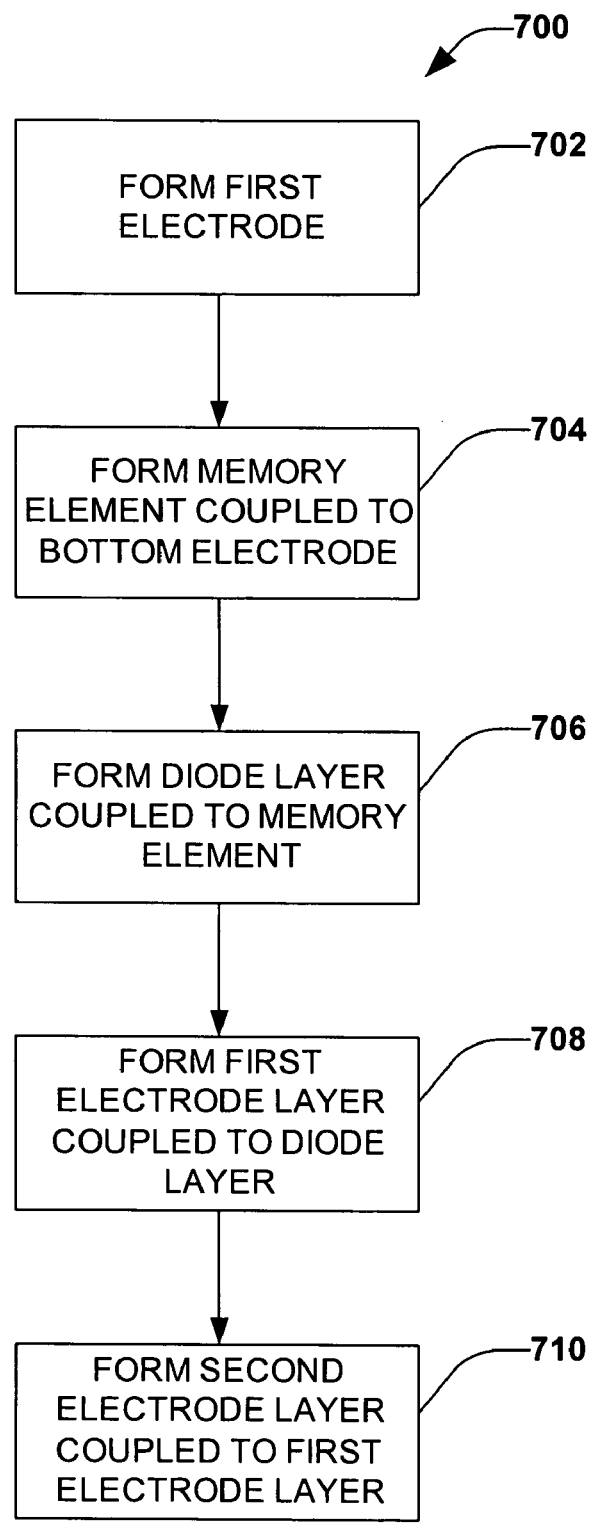
FIG. 7 is an illustration of a methodology for forming a memory cell comprising an injecting bilayer electrode in accordance an aspect of the invention.

In view of the exemplary systems shown and described above, a methodology, which may be implemented in accordance with one or more aspects of the invention, will be better appreciated with reference to the flow diagram of FIG. 7. While, for purposes of simplicity of explanation, the methodology is shown and described as a series of function blocks, it is to be understood and appreciated that the invention is not limited by the order of the blocks, as some blocks may, in accordance with the invention, occur in different orders and/or concurrently with other blocks from that shown and described herein. Moreover, not all illustrated blocks may be required to implement the methodology in accordance with one or more aspects of the invention. It is also to be appreciated that the blocks are merely to illustrate certain aspects of the invention in a simplified form and that these aspects may be illustrated via a lesser and/or greater number of blocks.

FIG. 7 is an illustration of a methodology 700 for forming a memory cell comprising one or more injecting bilayer electrodes in accordance with an aspect of the invention. The methodology 700 is a methodology for forming a memory cell comprising a first (bottom) electrode, a memory element, a selection diode, and an injecting bilayer diode. Although the methodology 700 illustrates a single layer anode and a bilayer cathode, it is understood that a similar methodology can be employed for a single layer cathode and a bilayer anode.

At reference 702, a first electrode is formed. In this example, the first electrode is an anode, however, it is understood that the first electrode can alternatively be cathode. Materials suitable for the first electrode include at least one material selected from a group consisting of tungsten, silver, titanium, chromium, germanium, gold, aluminum, barium, calcium, strontium, hafnium, zirconium, vanadium, copper, molybdenum, tantalum, magnesium, manganese, indium, iron, nickel, palladium, platinum, zinc, alloys thereof, indium-tin oxide, polysilicon, doped amorphous silicon, conducting polymers, semi-conducting polymers, PEDOT/PSS, polyaniline, polythiothene, polypyrrole material, conducting organic polymers, semi-conducting organic polymers, oligomers, monomers, conducting metal oxides, semi-conducting metal oxides, nitrides and silicides. Other suitable materials for the first electrode include Hastelloy®, Kovar®, Invar®, Monel®, Inconel®, brass, stainless steel, magnesium-silver alloy, and various other alloys. The first electrode may be formed by any suitable technique, such as, for example, via physical vapor deposition (PVD), i.e. thermal vacuum deposition, sputtering, e-beam deposition, etc. or chemical vapor deposition (CVD). CVD includes low pressure chemical vapor deposition (LPCVD), plasma enhanced chemical vapor deposition (PECVD) high density chemical vapor deposition (HDCVD) and other CVD techniques.

The methodology continues at 704 with the formation of a memory element. The memory element may comprise organic or inorganic materials. In the illustrated example, the memory element is an organic memory element comprised of at least one passive layer and at least one active layer. A passive region is deposited on top of the first electrode so as to couple to the first electrode. The passive region contains at least one conductivity facilitating compound that has the ability to donate and accept charges (holes and/or electrons). Generally, the conductivity facilitating compound has at least two relatively stable oxidation-reduction states which permit the conductivity facilitating compound to donate and accept charges. The passive region should also be capable of donating and accepting ions. According to one or more aspects of the invention, the passive region can be copper sulfide (CuxS) formed by physical vapor deposition (PVD), i.e. thermal vacuum deposition, sputtering, e-beam deposition, etc. or a chemical vapor deposition (CVD). Examples of other conductivity facilitating compounds that can be employed for the passive region include one or more of the following: tungsten oxide (WO3), molybdenum oxide (MoO3), titanium dioxide (TiO2), indium oxide (I3O4), silver sulfide (AgxS), copper selenide ($Cu_xSe$), iron oxide (Fe3O4), and the like.

An organic region is deposited adjacent to/or on top of the passive region. The organic region is formed and results in an interface between the passive region and the active region. The organic region can be formed via any number of suitable techniques. One technique involves growing the organic region from the passive region. Another technique is a spin-on or spray-on technique which involves depositing a mixture of the material and a solvent, and subsequently removing the solvent. Yet another suitable technique is chemical vapor deposition (CVD). CVD includes low pressure chemical vapor deposition (LPCVD), plasma enhanced chemical vapor deposition (PECVD), high density chemical vapor deposition (HDCVD) and other CVD techniques. It is not typically necessary to functionalize one or more ends of the organic molecule in order to attach it to an electrode/passive region. Sometimes a chemical bond forms between the conjugated organic polymer and the passive region.

The organic region is typically comprised of a conjugated organic material, such as a small organic molecule and a conjugated polymer. The conjugated organic molecule can be linear or branched such that the backbone retains its conjugated nature. Such conjugated molecules are characterized in that they have overlapping π orbitals and that they can assume two or more resonant structures. The conjugated nature of the conjugated organic materials contributes to the controllably conductive properties of the controllably conductive media. The organic region and the passive region are collectively referred to as a controllably conductive media or a controllably conductive region. The conductive properties of this media (e.g., highly conductive, conductive, semi-conductive, non-conductive) can be modified in a controlled manner by applying various voltages across the controllably conductive media via the two electrodes. In this connection, the conjugated organic material has the ability to donate and accept electrons. Generally, the conjugated organic molecule has at least two relatively stable oxidation-reduction states. The two relatively stable states permit the conjugated organic polymer to donate and accept charges and electrically interact with adjacent materials.

The organic material comprising the organic region may be cyclic or acyclic. For some cases, such as organic polymers, the organic material self assembles on the first electrode during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polypyrrole; polyfluorenes and related co-polymers; polyporphyrins; porphyrinic macrocycles, thiol derivatized polyporphyrins; poly(p-phenylene)s; poly(imide)s; polymetallocenes such as polyferrocenes, polyphthalocyanines; polyvinylenes; polystiroles; and the like. Another example of suitable organic materials for diode layer 306 include low-molecular-weight and polymer hole- and electron-transport materials, such as copper phthalocyanine and other phthalocyanines, diarylamines and triiarylamines, aluminum tris-hydroxyquinolate ($AlQ_3$), triazine derivatives, etc. Additionally, the properties of the organic material can be modified by doping with a suitable dopant.

At 706, a diode layer is coupled to the memory element. For the illustrated application, the diode layer is a polymer material that is suitable as a p-type conductor in one direction and an n-type conductor in the other direction. A material with these characteristics will facilitate the conduction of current by allowing the conduction of free electrons in one direction and holes in the other direction. It is understood that the diode layer may be comprised of a single material or may be comprised of more than one material. It is understood that the junction material can be organic, inorganic, or a combination of one or more organic materials and one or more inorganic materials. Examples of organic polymers include polymers comprising at least one material selected from the group consisting of polyacetylene, polyphenylacetylene, polydiphenylacetylene, polyaniline, poly(p-phenylene vinylene), polythiophene, polypyrrole, polyfluorenes and related co-polymers, polyporphyrins, porphyrinic macrocycles, thiol derivatized polyporphyrins, poly(p-phenylene)s, poly(imide)s, polymetallocenes such as polyferrocenes and polyphthalocyanines, polyvinylenes, and polystiroles. The diode layer may be deposited upon the memory element by any suitable process, such as, for example physical vapor deposition (PVD), i.e. thermal vacuum deposition, sputtering, e-beam deposition, etc. or chemical vapor deposition (CVD). CVD includes low pressure chemical vapor deposition (LPCVD), plasma enhanced chemical vapor deposition (PECVD), high density chemical vapor deposition (HDCVD) and other CVD techniques.

At reference numeral 708, the first electrode layer of an injecting bilayer electrode is deposited upon the diode layer. The injecting bilayer electrode may be either an anode or a cathode depending upon the particular application and composition. When the injecting bilayer electrode is an injecting bilayer cathode, the first cathode layer serves to enhance electron injection from second cathode layer into the organic polymer diode layer. In the case of an injecting bilayer cathode, in accordance with one aspect of the invention, the first layer of the injecting bilayer cathode may be formed by any suitable technique, such as, for example, deposition processes including, physical vapor deposition (PVD), i.e. thermal vacuum deposition, sputtering, e-beam deposition, etc. or chemical vapor deposition (CVD). CVD includes low pressure chemical vapor deposition (LPCVD), plasma enhanced chemical vapor deposition (PECVD), high density chemical vapor deposition (HDCVD) and other CVD techniques. There are numerous combinations of materials described supra which may be selected to implement the desired functionality of the first and second cathode layers of an injecting bilayer cathode.

Similarly, when the injecting bilayer electrode is an injecting bilayer anode, the first anode layer serves to enhance hole injection from second anode layer into the organic polymer diode layer. In the case of an injecting bilayer anode, in accordance with one aspect of the invention, the first layer of the bilayer anode may be formed by any suitable technique, such as, for example, deposition processes including, spin coating, physical vapor deposition (PVD), i.e. thermal vacuum deposition, sputtering, e-beam deposition, etc. or chemical vapor deposition (CVD). CVD includes low pressure chemical vapor deposition (LPCVD), plasma enhanced chemical vapor deposition (PECVD), high density chemical vapor deposition (HDCVD) and other CVD techniques. There are numerous combinations of materials described supra which may be selected to implement the desired functionality of the first and second anode layers of an injecting bilayer anode.

At 710, the second electrode layer of an injecting bilayer electrode is deposited upon the first electrode layer. Although the bilayer electrode may be either an injecting bilayer anode or an injecting bilayer cathode, in both instances case the second electrode layer is comprised of a thin layer of a metal. The second anode layer may be formed by any suitable technique, such as, for example, deposition processes including, physical vapor deposition (PVD), i.e. thermal vacuum deposition, sputtering, e-beam deposition, etc. or chemical vapor deposition (CVD). CVD includes low pressure chemical vapor deposition (LPCVD), plasma enhanced chemical vapor deposition (PECVD), high density chemical vapor deposition (HDCVD) and other CVD techniques. Suitable materials for the second electrode are described supra with respect to FIG. 5 in the case of an injecting bilayer cathode and FIG. 6 in the case of an injecting bilayer anode.

Figure 8:
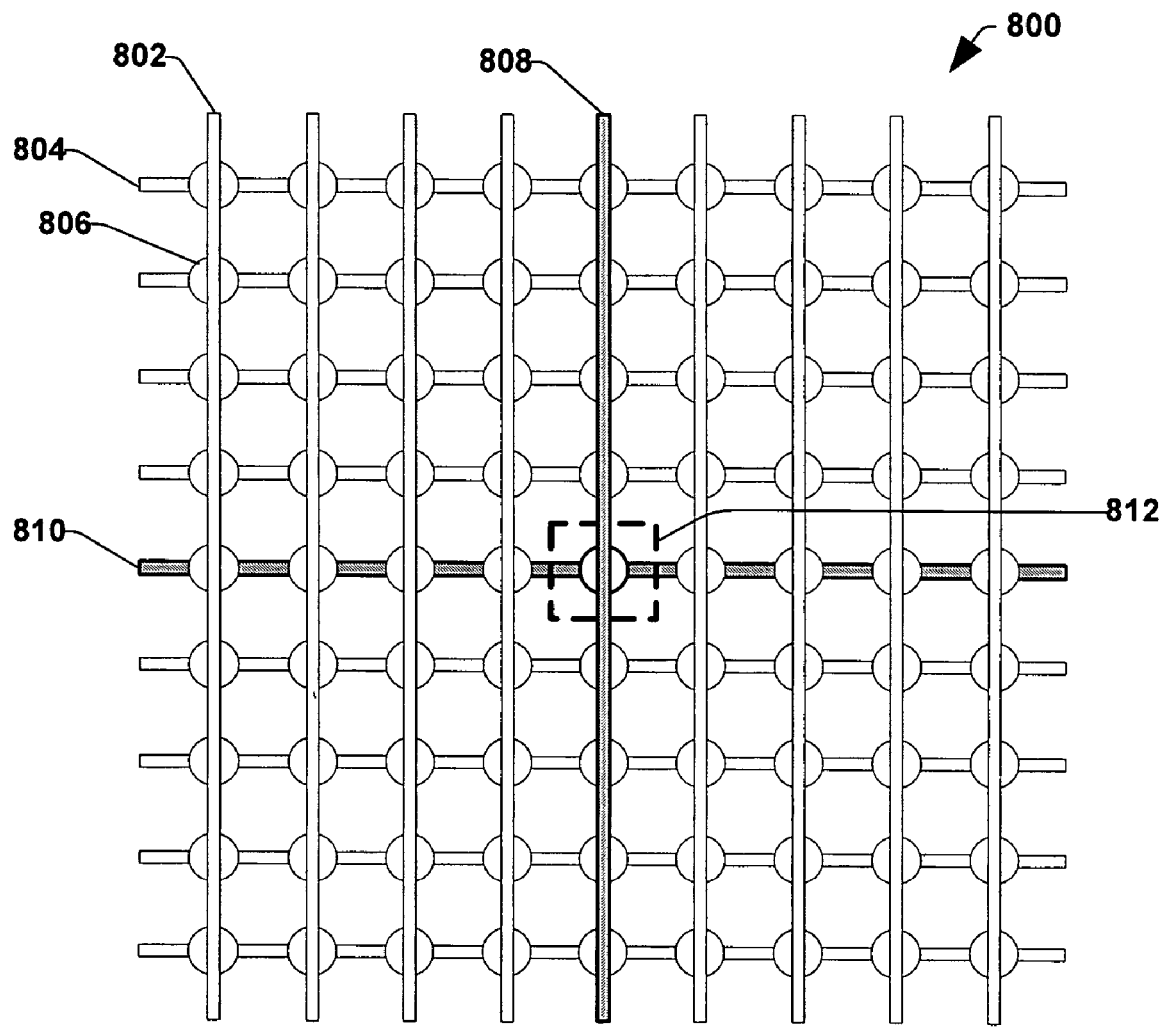
FIG. 8 illustrates a top view of a semiconductor memory array that employs memory cells comprising injecting bilayer electrodes in accordance with an aspect of the invention.

Turning now to FIG. 8, a top view of a semiconductor memory array 800 that employs memory cells comprised of one or more injecting bilayer electrodes in accordance with an aspect of the subject invention is depicted. Such an array is generally formed on a silicon based wafer, and includes a plurality of columns 802, referred to as bit line, and a plurality of rows 804, referred to as word line. Such bit line and word line can be connected to electrodes of memory cells 806, each memory cell 806 comprising one or more injecting bilayer electrodes formed in accordance with one or more aspects of the invention. In one embodiment, each memory cell is formed with an injecting bilayer cathode in accordance with an aspect of the invention. Although illustrated as an injecting bilayer cathode, it is understood that in accordance with another aspect of the invention, each memory cell may be comprised of an injecting bilayer anode instead of or in addition to an injecting bilayer cathode.

The intersection of a bit line and a word line constitutes the address of a particular memory cell. Data can be stored in the memory cells (e.g., as a 0 or a 1) by controlling and sending signals to appropriate columns and rows in the array (e.g., via a column address select CAS 808 and a row address select RAS 810, respectively, for memory cell 812.) For example, when a memory cell 812 has been chosen to be programmed, the appropriate bit line 808 and word line 810 that intersect the memory cell 812 are energized to appropriate voltage levels necessary for the desired function (e.g. read, write, erase). For example, it can be the combination of the two voltage level changes that alters the state of the memory cell 812. Even though other memory cells exist along bit line 808 and word line 810, only the cell 812, at the intersection of the appropriate bit line 808 and word line 810, actually changes to the appropriate state. The bit line voltage level alone or the word line voltage level alone is not enough to program the other devices connected to these lines. Accordingly, only the component 812 that is connected to both lines can surpass the threshold voltage levels required in order to alter a memory cell of the invention. In accordance with one aspect of the invention, the injecting bilayer electrode(s) utilized in the selected memory cell facilitate a significant improvement in charge injection into the diode layer of the selected memory cell. In accordance with another aspect of the invention, the increased charge density in the diode layer results in improved memory cell switching times and lowers the voltage required for the memory cell to operate, thereby, creating a more efficient memory array.

Figure 9:
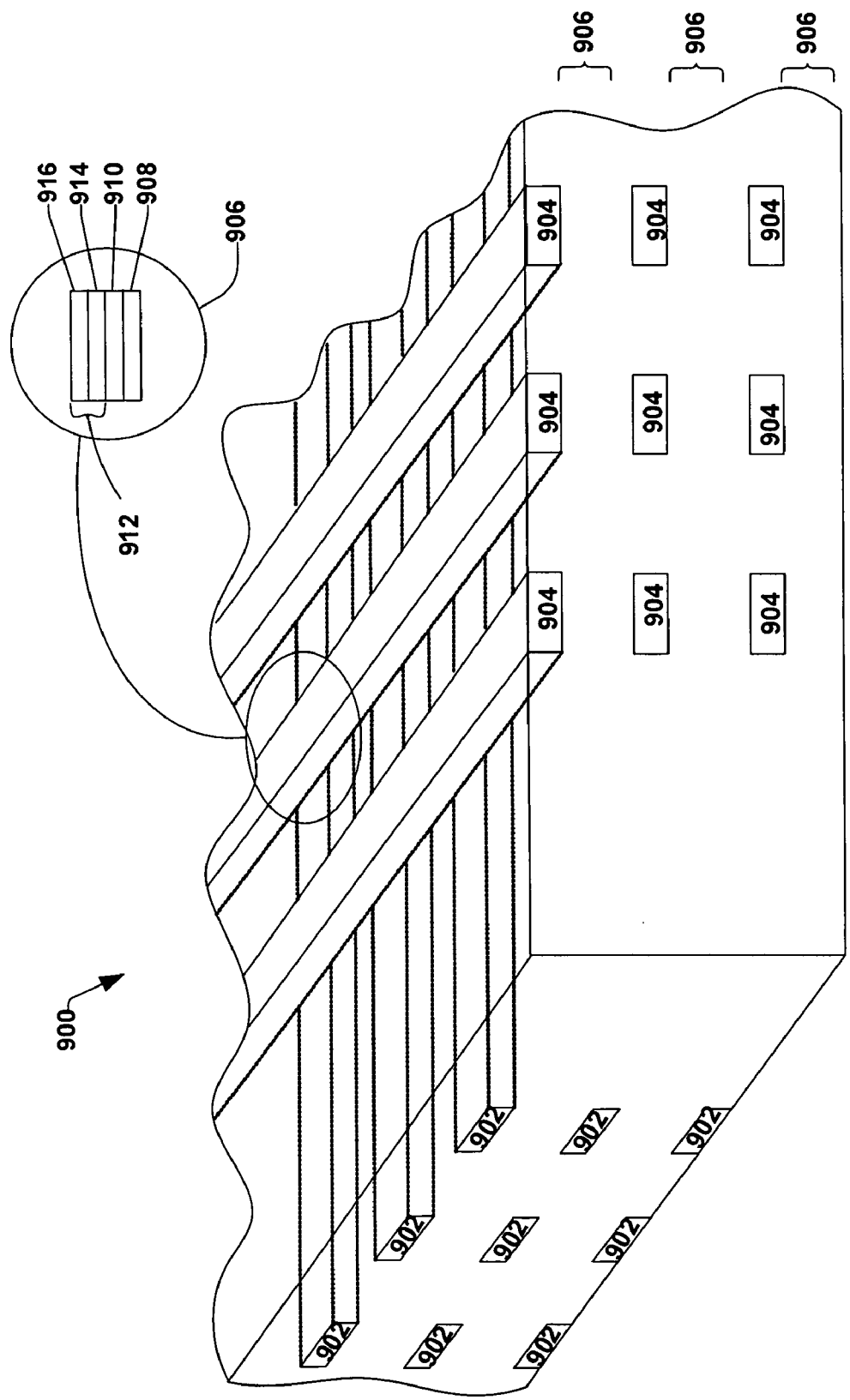
FIG. 9 is a three dimensional view of an organic memory array comprising a plurality of memory cells arranged in a three dimensional array wherein each memory cell comprises injecting bilayer electrodes in accordance with an aspect of the invention.

Similarly, FIG. 9 illustrates a memory array 900 which utilizes injecting bilayer electrode memory cells formed in accordance with one or more aspects of the invention. In accordance with one or more aspects of the invention, injecting bilayer electrode memory cells facilitate the formation of high speed, densely populated, efficient memory arrays.

FIG. 9 is a three dimensional view of an organic memory array 900 comprising a plurality of memory cells arranged in a three dimensional array. The memory array 900 contains a plurality of control lines (e.g., word lines and bit lines) 902 and 904 and a plurality of memory cells 906. Each memory cell 906 is comprised of a memory element 908, a diode layer 910, and an injecting bilayer electrode 912 formed in accordance with an aspect of the invention. The Injecting bilayer electrode 912 is formed in accordance with one or more aspects of the invention and is comprised if a first electrode layer 914 and a second electrode layer 916.

In accordance with another aspect of the invention, the control line 904 may comprise the second electrode layer of the injecting bilayer electrode such that the memory cell need only comprise the first electrode layer 914 of the injecting bilayer electrode, the diode layer 910, and the memory element 908. In accordance with yet, another aspect of the invention, the control line 904 may be a bilayer control line which comprises both the first electrode layer and the second electrode layer of the injecting bilayer electrode such that the memory cell need only comprise the diode layer 910, and the memory element 908.

The illustrated three dimensional microelectronic organic memory array is capable of containing an extremely high number of memory cells thereby improving device density. In accordance with one aspect of the invention, the injecting bilayer electrodes utilized in the memory array 900 facilitate a significant improvement in charge injection into the diode layers 910 of selected memory cells. In accordance with another aspect of the invention, the increased charge density in the diode layer of the selected memory cells results in improved memory cell switching times and lowers the voltage required for the memory cell to operate, thereby, creating a more efficient memory array.

What has been described above includes examples of the invention. It is, of course, not possible to describe every conceivable combination of components or methodologies for purposes of describing the invention, but one of ordinary skill in the art can recognize that many further combinations and permutations of the invention are possible. Accordingly, the invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A memory cell, comprising:
a bottom electrode;
a memory element formed over the bottom electrode;
a diode layer formed over the memory element; and
an injecting bilayer electrode comprising a first electrode layer and a second electrode layer formed over said diode layer.

2. The memory cell of claim 1, the diode layer comprises an organic material and the memory element comprises a controllably conductive media.

3. The memory cell of claim 2, the organic material for the diode layer is one of a polymer, an oligomer and a low-molecular weight organic material.

4. The memory cell of claim 3, the polymer comprises at least one material selected from a group consisting of polyacetylene, polyphenylacetylene, polydiphenylacetylene, polyaniline, polypyrrole, polyfluorenes and related co-polymers, poly(p-phenylene vinylene), polythiophene, polyporphyrins, porphyrinic macrocycles, thiol derivatized polyporphyrins, poly(p-phenylene)s, poly(imide)s, polymetallocenes such as polyferrocenes and polyphthalocyanines, polyvinylenes, and polystiroles, and co-polymers.

5. The memory cell of claim 3, the low-molecular weight material comprises a hole- and an electron-transport material selected from a group consisting of phthalocyanines, diarylamines, triarylamines, starburst materials, NaF, KF, RbF aluminum tris-hydroxyquinolate ($AlQ_3$), and triazine derivatives.

6. The memory cell of claim 3, the polymer or organic material comprises at least one material selected from a group consisting of copper phthalocyanine (CuPc), polyaniline (PANI), and polyethylenedioxythiophene (PEDOT).

7. The memory cell of claim 2, the controllably conductive media comprises at least one active region and at least one passive region.

8. The memory cell of claim 2, the bottom electrode is a cathode and the injecting bilayer electrode is an injecting bilayer anode, the first electrode layer comprises a first anode layer and the second electrode layer comprises a second anode layer.

9. The memory cell of claim 8, the cathode comprises at least one material selected from a group consisting of barium, calcium, copper, molybdenum, tantalum, tungsten, silver, titanium, chromium, germanium, gold, aluminum, magnesium, manganese, indium, iron, nickel, palladium, platinum, zinc, samarium, europium, terbium, strontium, hafnium, zirconium, vanadium, rhenium, rhodium, osmium, niobium, praseodymium, ytterbium, lanthanum, cesium, rubidium, alloys thereof, indium-tin oxide, polysilicon, doped amorphous silicon, metal silicides, conducting polymers, semi-conducting polymers, PEDOT/PSS, polyaniline, polythiophene material, conducting organic polymers, semi-conducting organic polymers, oligomers, monomers, conducting metal oxides, semi-conducting metal oxides, nitrides and silicides.

10. The memory cell of claim 8, the second anode layer comprises a layer greater than about 200 nm thick of at least one material selected from a group consisting of tungsten, silver, titanium, chromium, germanium, gold, aluminum, copper, molybdenum, tantalum, magnesium, manganese, indium, iron, nickel, palladium, platinum, zinc, alloys thereof, indium-tin oxide, polysilicon, doped amorphous silicon, conducting polymers, semi-conducting polymers, PEDOT/PSS, polyaniline, polythiophene, polypyrrole material, conducting organic polymers, semi-conducting organic polymers, oligomers, monomers, conducting metal oxides, semi-conducting metal oxides, nitrides and silicides.

11. The memory cell of claim 8, first anode layer is a doped organic layer which comprises at least one material selected from a group consisting of doped PEDOT, polythiophene, polyaniline, polypyrrole, diarylamine, triarylamine, and starburst organic materials.

12. The memory cell of claim 11, the dopant for the organic layer comprises at least one material selected from a group consisting of PSS, $FeCl_3$, metal chlorides, $NOPF_6$, TCNQ, $F_4TCNQ$, TCNE, and strong electron acceptors.

13. The memory cell of claim 1, the bottom electrode is an anode and the injecting bilayer electrode is an injecting bilayer cathode, the first electrode layer comprises a first cathode layer and the second electrode layer comprises a second cathode layer.

14. The memory cell of claim 13, the anode comprises at least one material selected from a group consisting of tungsten, silver, titanium, chromium, germanium, gold, aluminum, copper, molybdenum, tantalum, magnesium, manganese, indium, iron, nickel, palladium, platinum, zinc, strontium, hafnium, zirconium, vanadium, alloys thereof, indium-tin oxide, polysilicon, doped amorphous silicon, conducting polymers, semi-conducting polymers, PEDOT/PSS, polyaniline, polythiophene, polypyrrole, conducting organic polymers, semi-conducting organic polymers, oligomers, monomers, conducting metal oxides, semi-conducting metal oxides, nitrides and silicides.

15. The memory cell of claim 13, the first cathode layer comprises a layer about 0.5-1.5 nm thick of at least one material selected from a group consisting of LiF, NaF, KF, RbF and CsF, and the second cathode layer comprises a layer greater than about 200 nm thick of at least one material selected from a group consisting of aluminum, calcium, barium, magnesium, and indium-tin oxide.

16. The memory cell of claim 15, the second cathode layer comprises a thin layer greater than about 200 nm thick of at least one material selected from a group consisting of aluminum, calcium, and indium-tin oxide.

17. The memory cell of claim 13, the first cathode layer comprises a layer about 10-50 nm thick of at least one material selected from a group consisting of Ca, Ba, Sm, Eu, Yb, Tb, Pr, Cs, Rb, K, Na, and Li, and the second cathode layer comprises a layer greater than about 200 nm thick of at least one material selected from a group consisting of tungsten, silver, titanium, chromium, germanium, gold, aluminum, copper, molybdenum, tantalum, magnesium, manganese, indium, iron, nickel, palladium, platinum, zinc, alloys thereof, indium-tin oxide, polysilicon, doped amorphous silicon, conducting polymers, semi-conducting polymers, PEDOT/PSS, polyaniline, polythiophene, polypyrrole material, conducting organic polymers, semi-conducting organic polymers, oligomers, monomers, conducting metal oxides, semi-conducting metal oxides, nitrides and silicides.

18. The memory cell of claim 13, the first cathode layer comprises a layer about 10-50 nm thick of an alloy of at least one material selected from a group consisting of Ca, Ba, Sm, Eu, Yb, Tb, Pr, Cs, Rb, K, Na, and Li and at least one material selected from a group consisting of tungsten, silver, titanium, chromium, germanium, gold, aluminum, copper, molybdenum, tantalum, magnesium, manganese, indium, iron, nickel, palladium, platinum, zinc and the second cathode layer comprises a layer greater than about 200 nm thick of at least one material selected from a group consisting of tungsten, silver, titanium, chromium, germanium, gold, aluminum, copper, molybdenum, tantalum, magnesium, manganese, indium, iron, nickel, palladium, platinum, zinc, alloys thereof, indium-tin oxide, polysilicon, doped amorphous silicon, conducting polymers, semi-conducting polymers, PEDOT/PSS, polyaniline, polythiophene, polypyrrole material, conducting organic polymers, semi-conducting organic polymers, oligomers, monomers, conducting metal oxides, semi-conducting metal oxides, nitrides and silicides.

19. The memory cell of claim 13, the first cathode layer comprises a layer about 2-50 nm thick of a diode organic material incorporating atoms or nanoparticles of at least one material selected from a group consisting of Ca, Ba, Mg, K, Na, Sm, Eu, Yb, Tb, Pr, Cs, Rb, and Li, and the second cathode layer comprises a layer greater than about 200 nm thick of at least one material selected from a group consisting of tungsten, silver, titanium, chromium, germanium, gold, aluminum, copper, molybdenum, tantalum, magnesium, manganese, indium, iron, nickel, palladium, platinum, zinc, alloys thereof, indium-tin oxide, polysilicon, doped amorphous silicon, conducting polymers, semi-conducting polymers, PEDOT/PSS, polyaniline, polythiophene, polypyrrole material, conducting organic polymers, semi-conducting organic polymers, oligomers, monomers, conducting metal oxides, semi-conducting metal oxides, nitrides and silicides.

\* \* \* \* \*